(12) United States Patent
Seog et al.

(10) Patent No.: US 11,521,871 B2
(45) Date of Patent: Dec. 6, 2022

(54) RAPID THERMAL PROCESSING APPARATUS

(71) Applicant: ULTECH CO., LTD., Daegu (KR)

(72) Inventors: Changgil Seog, Daegu (KR); Daeyoung Kong, Daegu (KR)

(73) Assignee: ULTECH CO., LTD., Daegu (KR)

( * ) Notice: Subject to any disclaimer, the term of this patent is extended or adjusted under 35 U.S.C. 154(b) by 226 days.

(21) Appl. No.: 16/921,204

(22) Filed: Jul. 6, 2020

(65) Prior Publication Data
US 2021/0183673 A1    Jun. 17, 2021

(30) Foreign Application Priority Data

Dec. 13, 2019    (KR) .......................... 10-2019-0166854

(51) Int. Cl.
| | | |
|---|---|---|
| *G01K 7/02* | (2021.01) | |
| *H01L 21/67* | (2006.01) | |
| *H01L 21/66* | (2006.01) | |

(52) U.S. Cl.
CPC .......... *H01L 21/67248* (2013.01); *G01K 7/02* (2013.01); *G01K 7/023* (2013.01); *H01L 21/67098* (2013.01); *H01L 22/32* (2013.01)

(58) Field of Classification Search
CPC ........ H01L 21/67098; H01L 21/67248; G01K 7/02; G01K 7/023
See application file for complete search history.

(56) References Cited

U.S. PATENT DOCUMENTS

| | | | |
|---|---|---|---|
| 10,600,661 B2 | 3/2020 | Seog et al. | |
| 2008/0190364 A1* | 8/2008 | Mahon | ................ H01L 21/6831 134/1.1 |
| 2020/0386621 A1* | 12/2020 | Pergande | .................. G01J 5/10 |
| 2021/0244103 A1* | 8/2021 | Courbat | ............... H05B 6/1254 |

FOREIGN PATENT DOCUMENTS

| | | |
|---|---|---|
| JP | S60-37116 A | 2/1985 |
| KR | 10-1998-039936 A | 8/1998 |
| KR | 10-2002-0019016 A | 3/2002 |
| KR | 10-0337107 B1 | 5/2002 |
| KR | 10-0395662 B1 | 8/2003 |
| KR | 10-0423184 B1 | 3/2004 |
| KR | 10-1605079 B1 | 3/2016 |
| WO | WO 00/66987 A1 | 11/2000 |

* cited by examiner

*Primary Examiner* — Jae Lee
(74) *Attorney, Agent, or Firm* — Fenwick & West LLP

(57) ABSTRACT

The present disclosure relates to a rapid thermal processing apparatus for rapid heat treatment of a substrate, and particularly, to increasing the accuracy in measuring the temperature of a substrate to be thermally processed by configuring a thermocouple for measuring the temperature of the substrate under the same conditions as the substrate to be thermally processed so as to be attached to and detached from the chamber, and the present disclosure provides a rapid thermal processing apparatus having a thermocouple installed to measure a temperature of a substrate to be thermally processed located inside a chamber, and the rapid thermal processing apparatus includes a mounting hole formed in the chamber, and a thermocouple kit inserted into and mounted to the mounting hole so that a bonding portion of a thermocouple wire is located at a thermocouple substrate extending into the chamber.

8 Claims, 6 Drawing Sheets

RAPID THERMAL PROCESSING APPARATUS

CROSS-REFERENCE TO RELATED APPLICATION

This application claims priority to Republic of Korea Patent Application No. 10-2019-0166854, filed on Dec. 13, 2019, which is incorporated by reference in its entirety.

BACKGROUND

1. Field

The present disclosure relates to a rapid thermal processing apparatus for rapid heat treatment of a substrate, and particularly, to accurately measuring the temperature of a substrate to be thermally processed in real time by mounting a thermocouple wire to the substrate having the same conditions as the substrate to be thermally processed to measure the temperature of the substrate to be thermally processed so as to be detached from a chamber.

DESCRIPTION ABOUT NATIONAL RESEARCH AND DEVELOPMENT SUPPORT

This study was supported by the fostering local specialized industries and fostering local flagship industries program of the Ministry of SMEs and Startups, Republic of Korea (Projects No. P0002826 and P0009611).

2. Description of the Related Art

As a semiconductor device is more integrated and a substrate has an increased size, there are many demands for reducing the manufacturing cost of the semiconductor device. In response to these demands, a rapid thermal process is mainly used among various heat treatment processes.

In the rapid thermal process, the temperature of a substrate must be precisely controlled because the substrate is heated and cooled in a relatively wide temperature range for a very short time. In addition, in order to perform the rapid thermal process while maintaining a uniform temperature distribution of the substrate, it is necessary to maintain the same thermal properties throughout the entire region of the substrate. In order to achieve temperature uniformity throughout the entire region of the substrate, it is necessary to properly arrange substrate heating lamps and properly adjust the power supplied to each lamp so that a uniform heat flux may be formed throughout the entire region of the substrate.

However, since there are various variables such as the flow rate and flow of gas flowing into a chamber for the rapid thermal process and the internal structure of the chamber at lower and side portions of the substrate, it is not easy to ensure temperature uniformity throughout the entire region of the substrate only by optimizing the hardware chamber design.

Accurately measuring the temperature of a large-area substrate in the rapid thermal process chamber is recognized as an important factor in determining the reliability of the rapid thermal process and the quality of the semiconductor device.

The method of measuring the temperature of the substrate by the rapid thermal processing chamber is classified into a contact type or a non-contact type depending on whether the substrate and the temperature measuring means are in contact, and the non-contact temperature measuring method is mainly used to reduce damage to the substrate caused by contact between the temperature measuring means and the substrate. In addition, in order to obtain uniform process characteristics throughout the entire region of the substrate, instead of a fixed rapid thermal processing apparatus in which the substrate is fixed in the rapid thermal processing chamber without horizontally rotating during the rapid thermal process, a rotating rapid thermal processing apparatus in which the substrate is rotated is mainly used. Since the conventional non-contact substrate temperature measuring method uses a pyrometer, during the rapid thermal process, for example, the state of the substrate, namely emissivity according to temperature, geometrical properties of the chamber, the spectral wavelength of the pyrometer, and the type and thickness of a film formed on the substrate influence the optical measurement of the pyrometer.

Therefore, the conventional non-contact substrate temperature measuring method has a low real-time measurement accuracy with respect to the temperature of the substrate, for example a rotating wafer, and thus it is difficult to precisely perform the rapid thermal process. In addition, since the pyrometer is more expensive than a thermocouple wire, it is difficult to reduce the manufacturing cost of the rapid thermal processing apparatus.

Meanwhile, a conventional metal heat treatment apparatus includes, as shown in FIG. 1, a rapid thermal processing chamber 10, a rotating unit 30 disposed at an inner lower side of the chamber 10 to support and rotate the rapid thermal processing substrate 1, a heat source device 20 disposed at an inner upper side of the chamber 10 to rapidly heat the rapid thermal processing substrate 1 by radiating light, a temperature measurement substrate 50 disposed at a distance on a part of the rapid thermal processing substrate 1 and made of the same material as the rapid thermal processing substrate 1, a temperature measuring thermocouple 60 installed to the temperature measurement substrate 50 to measure a temperature of the temperature measurement substrate 50, a support unit 70 made of a light transmitting material and supporting the temperature measurement substrate 50, and a light transmission plate 40 disposed between the support unit 70 and the heat source device 20 to isolate both inner spaces of the chamber 10. Here, the temperature of the temperature measurement substrate 50 measured by the thermocouple 60 is considered as the temperature of the rapid thermal processing substrate 1.

Since the rapid thermal processing substrate and the temperature measurement substrate are positioned close to each other inside the chamber, two substrates are under the same conditions in the chamber. Also, since the temperature of the temperature measurement substrate is measured using a thermocouple in this state, the temperature is measured indirectly or indirectly. Namely, the temperature is measured directly by the thermocouple, and the temperature of the temperature measurement substrate under the same conditions as the rapid thermal processing substrate is indirectly measured.

However, in the rapid thermal processing apparatus configured as described above, since the temperature measurement substrate is mounted to the support unit and supported by the support unit 70 as shown in FIG. 1, when the rapid heat processing substrate is replaced, it is required to disassemble the temperature measurement substrate mounted to the support unit from the support unit, draw the disassembled temperature measurement substrate out of the chamber and replace it with the temperature measurement substrate identical to the rapid heat processing substrate.

The replacing work has to be performed through a narrow opening of the chamber, thereby damaging precision devices and causing work inconvenience.

In addition, since the support unit made of a light transmitting material is provided inside the chamber to support the temperature measurement substrate, the support unit may directly affect the air flow change inside the chamber, thereby increasing the defect rate.

SUMMARY

The present disclosure is designed to solve the problems of the prior art as described above, and the present disclosure is directed to providing a rapid thermal processing apparatus configured to indirectly read the temperature of a substrate to be actually thermally processed in real time.

To accomplish the above object, the present disclosure provides a rapid thermal processing apparatus, which includes a thermocouple installed to measure a temperature of a substrate to be thermally processed located inside a chamber, the rapid thermal processing apparatus comprising: a mounting hole formed in the chamber; and a thermocouple kit inserted into and mounted to the mounting hole so that a bonding portion of a thermocouple wire is located at a thermocouple substrate extending into the chamber.

In addition, according to one embodiment of the present disclosure, the thermocouple kit may include a feed-through mounted in the mounting hole, a thermocouple substrate extending into the chamber from the feed-through, and a plurality of thermocouple wires extending from the outside of the chamber into the chamber through pin holes formed in the feed-through.

In addition, according to one embodiment of the present disclosure, the thermocouple substrate put into the chamber may extend in a diameter direction of the substrate to be thermally processed, so that an end of the thermocouple substrate is located at a point not exceeding a center point of the substrate to be thermally processed.

In addition, according to one embodiment of the present disclosure, the feed-through may include a support rod inserted into and supported by the mounting hole, a flange formed at a rear side of the support rod and coming into contact with an outer surface of the chamber in a state where the support rod is inserted into the mounting hole, and a fastening means for fastening the flange to the chamber or releasing therefrom.

In addition, according to one embodiment of the present disclosure, an end of the thermocouple substrate may be inserted into the support rod, and an insulator may be located between the thermocouple substrate and an inner surface of the support rod to block heat transfer between the thermocouple substrate and the support rod.

In addition, according to one embodiment of the present disclosure, the support rod may include a body having both sidewalls and a bottom, and a cover for covering an open top surface of the body, and the insulator may be located at an upper surface of the bottom, the end of the thermocouple substrate may be placed on an upper surface of the insulator, and the cover may be fastened to the body to cover the insulator in a state where the insulator is placed on an upper surface of the end of the thermocouple substrate.

In addition, according to one embodiment of the present disclosure, a plurality of tabs may be formed at upper surfaces of both sidewalls, and a bolt may be inserted into a perforation hole formed in the cover corresponding to the tab and be fastened to the tab to fix the cover to the body so that the insulators and the thermocouple substrate located therein are fixed.

In addition, according to one embodiment of the present disclosure, a thermocouple bonding portion may be formed in a perforation hole formed at an end of the thermocouple substrate, and the thermocouple bonding portion may be formed to protrude at a bottom surface of the thermocouple substrate through the perforation hole.

In addition, according to one embodiment of the present disclosure, the support rod may have a tube shape, and the thermocouple substrate may have a width identical to or smaller than an inner diameter of the support rod so that both ends of the width are processed to have a curvature radius of the support rod.

In addition, according to one embodiment of the present disclosure, a susceptor may be located at a bottom surface of the thermocouple substrate, or a top surface and a bottom surface thereof.

As described above, since the rapid thermal processing apparatus according to the present disclosure measures the temperature of the thermocouple substrate under the same conditions as the substrate to be thermally processed through the thermocouple wire, it is possible to indirect measure the temperature in the same way as directly measuring the temperature of the substrate to be thermally processed.

Therefore, since the bonding portion of the thermocouple wire does not come into contact with the thermal processing substrate, the defects of the substrate are reduced. Also, since the temperature of the thermocouple substrate under the same conditions is directly measured, the temperature value is highly accurate.

In addition, since the rapid thermal processing apparatus according to the present disclosure uses a thermocouple kit so that the thermocouple kit is attached to and detached from the chamber after changing the conditions of the thermocouple substrate mounted to the thermocouple kit according to the conditions of the substrate to be thermally processed, work convenience is excellent.

Also, in the prior art, the equipment for supporting the thermocouple substrate must be mounted inside the chamber. However, in the present disclosure, the supporting equipment is mounted outside the chamber in the form of a kit, thereby improving the work efficiency and the quality of the substrate in comparison to the prior art.

DETAILED DESCRIPTION

Hereinafter, one embodiment of a rapid thermal processing apparatus according to the present disclosure will be described in detail with reference to the accompanying drawings.

Figure 1:
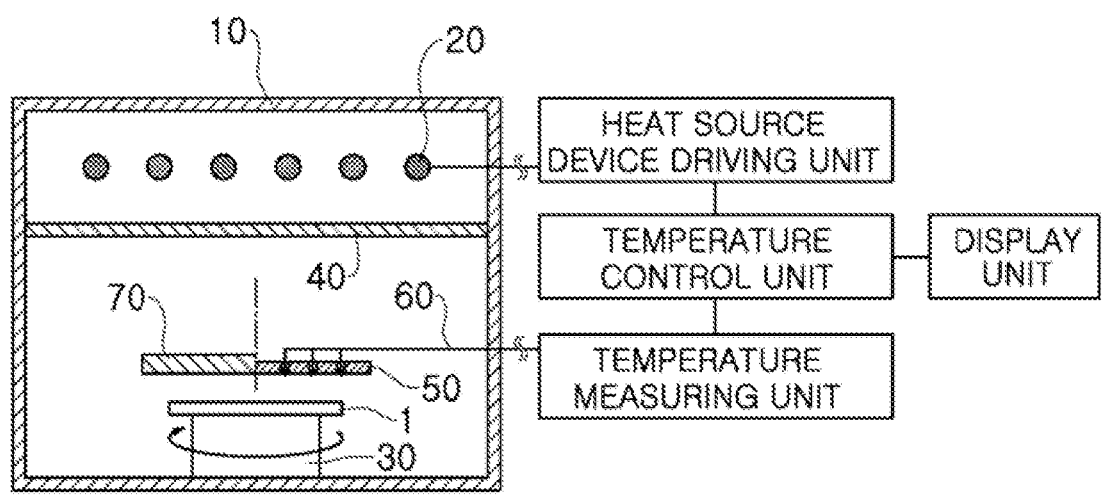
FIG. 1 is a diagram showing a rapid thermal processing apparatus according to the prior art.
Figure 2:
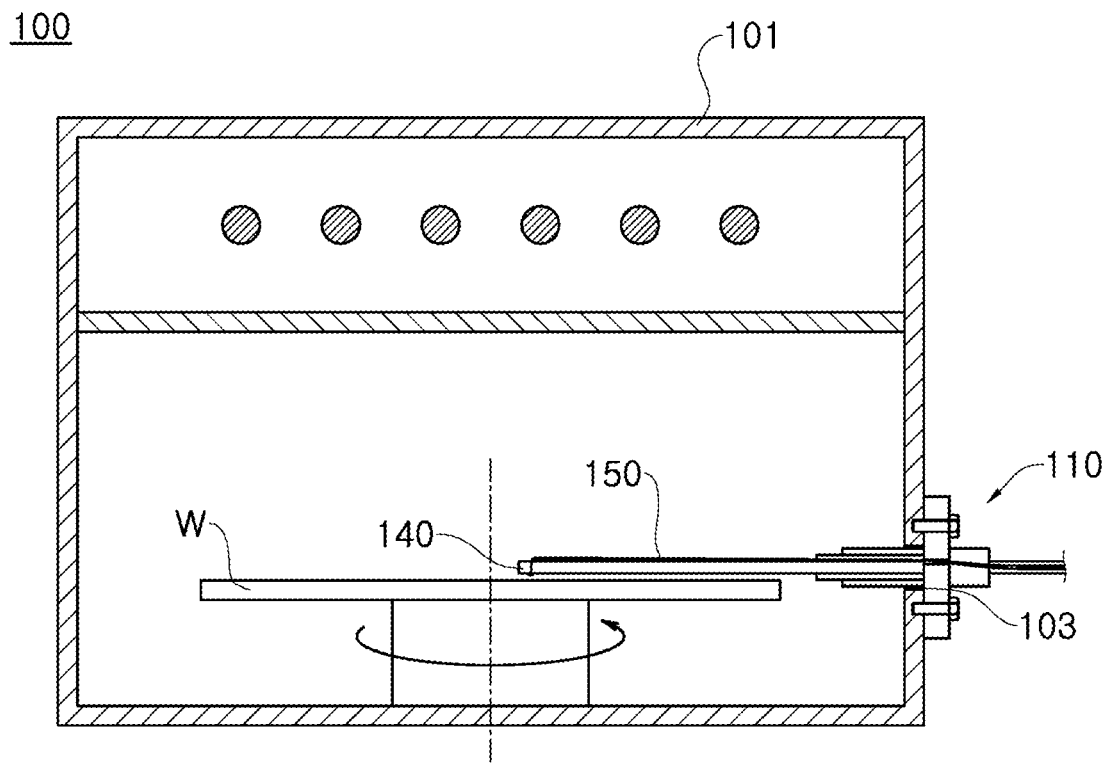
FIG. 2 is a sectional view showing a thermal processing apparatus according to one embodiment of the present disclosure.
Figure 3:
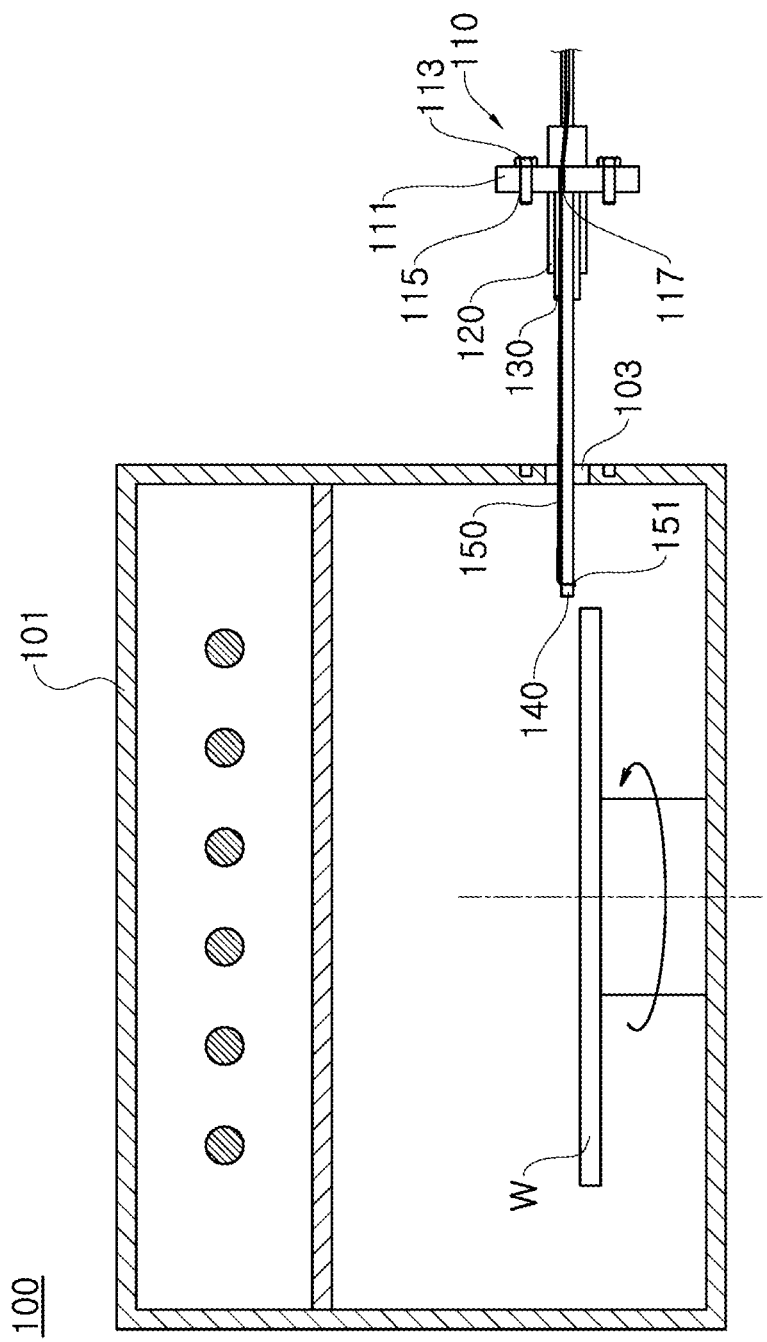
FIG. 3 is a sectional view showing a thermocouple kit of FIG. 2 disassembled from a chamber according to one embodiment of the present disclosure.
Figure 4A:
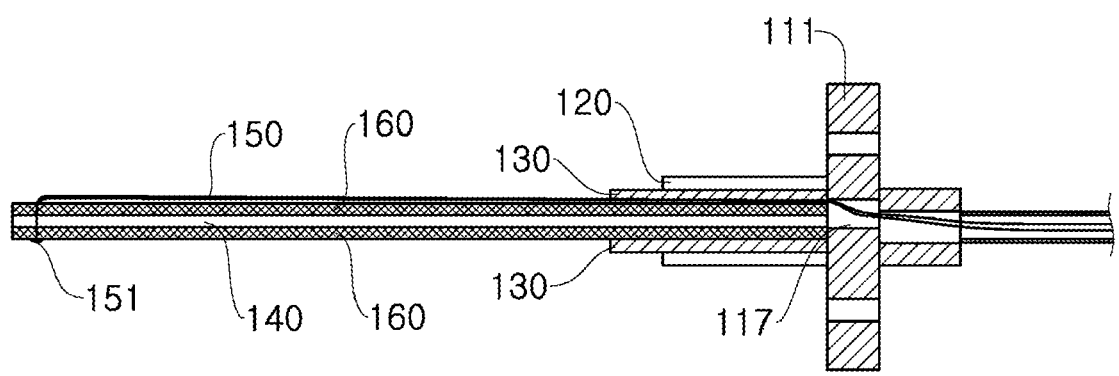
FIG. 4A and FIG. 4B are diagrams showing a thermocouple substrate of FIG. 3 to which a susceptor is mounted according to one embodiment of the present disclosure.
Figure 4B:
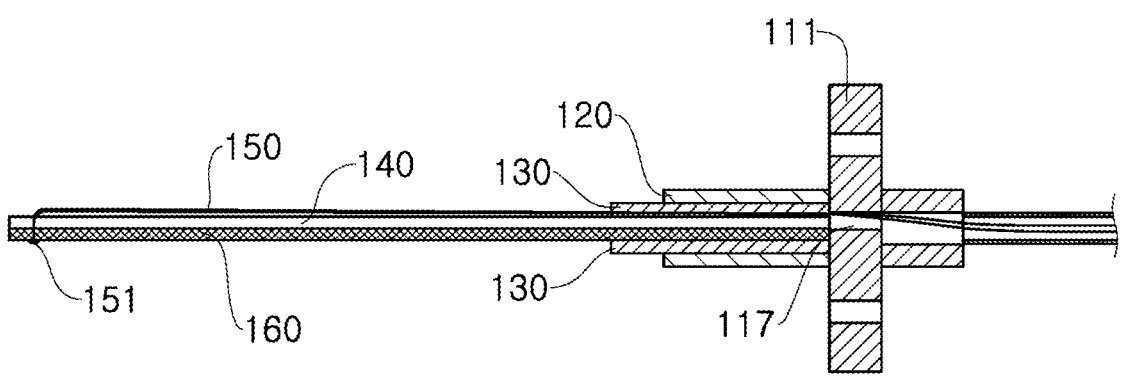
Figure 5:
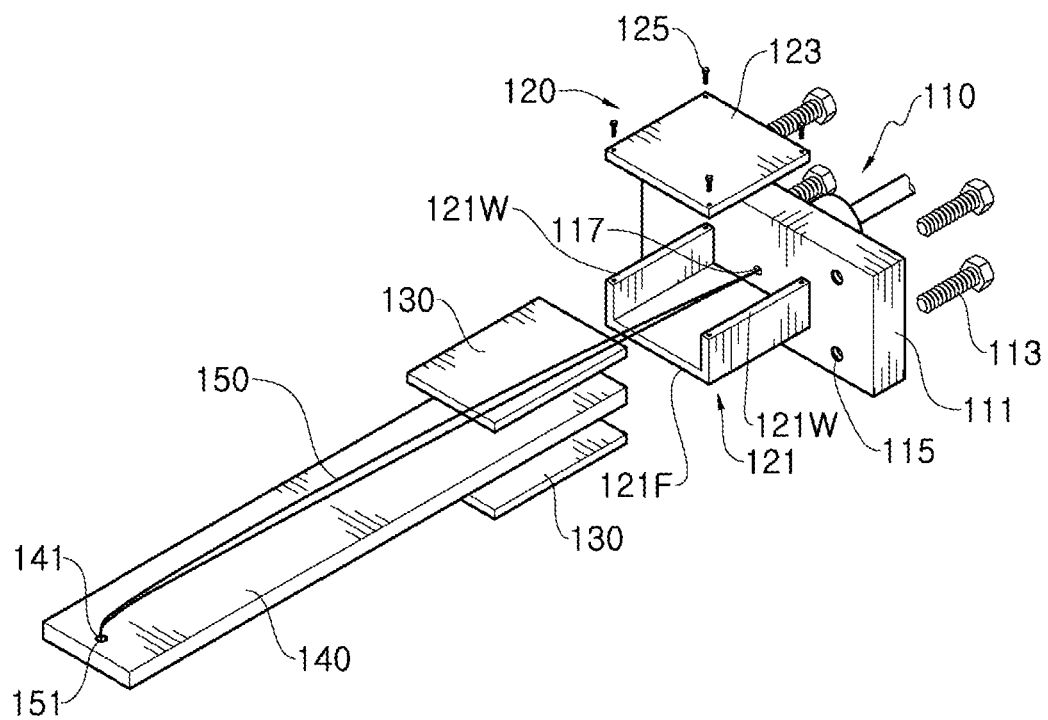
FIG. 5 is an exploded perspective view showing a support rod of the thermocouple kit of FIG. 3 according to one embodiment of the present disclosure.

In the drawings, FIG. 2 is a sectional view showing a thermal processing apparatus according to the present disclosure, FIG. 3 is a sectional view showing a thermocouple kit of FIG. 2 disassembled from a chamber, FIG. 4A and FIG. 4B are diagrams showing a thermocouple substrate of FIG. 3 to which a susceptor is mounted, FIG. 5 is an exploded perspective view showing a support rod of the thermocouple kit of FIG. 3, and FIG. 6A to FIG. 6C are diagrams showing a kit where a tube-type insulator is mounted to the thermocouple kit of FIG. 3.

As shown in FIGS. 2 and 3, a rapid thermal processing apparatus includes a mounting hole 103 formed at a side of a chamber 101 so that a thermocouple kit 100 is inserted and mounted therein. A thermocouple feed-through 110 is inserted into the mounting hole 103 and mounted to the chamber 101 by fastening a bolt 113 that is a fastening means, and the feed-through 110 may be detached from the chamber 101 by releasing the fastened bolt 113.

Hereinafter, the thermocouple kit configured as described above will be described in detail.

As shown in FIGS. 2 and 3, the feed-through 110 of the thermocouple kit 100 includes a flange 111 formed at a front side and fastened by a bolt 113 in contact with an outer surface of the chamber 101, and a support rod 120 formed at a front side of the flange 111 and inserted into the mounting hole 103 of the chamber 101 to contact an inner surface of the mounting hole 103.

Four bolt holes 115 are formed at four corners of the flange 111 having a rectangular structure so that the bolt 113 passes therethrough. When the support rod 120 of the feed-through 110 is inserted into the mounting hole 103, the bolt 113 located at the flange 111 is screwed to a tab (not shown) formed at the outer surface of the chamber 101.

As the flange 111 is fastened by the bolt to the outer surface of the chamber 101 in a state where the support rod 120 of the feed-through 110 is inserted into the mounting hole 103, the feed-through 110 is mounted to the chamber 101. Conversely, if the fastened bolt 113 is released and disassembled, the feed-through 110 may be drawn out of the mounting hole 103 and detached.

Meanwhile, two insulators 130 are located at inner upper and lower portions of the support rod 120, and a thermocouple substrate 140 is located between the two insulators 130.

Since heat transfer is blocked by the insulators 130 positioned in contact with the upper and lower surfaces of the thermocouple substrate 140, the heat transfer between the outside of the chamber 101 and the thermocouple substrate 140 is blocked. Accordingly, the temperature of a substrate W to be thermally processed may be accurately measured by the thermocouple wire 150.

The material of the insulator 130 is quartz in one embodiment in order to reduce light interference of the thermocouple substrate 140 as the insulator 130 is transparent.

Meanwhile, the thermocouple substrate 140 is made of the same material as the substrate W to be thermally processed, for example any one of Si, SiC, ceramics, sapphire and quarts, in order to measure an actual temperature of the substrate W to be thermally processed. As a center of the rotating substrate W to be thermally processed, which rotates during the thermally processing, is in a regular position, the thermocouple substrate 140 is located in a diameter direction of the substrate W to be thermally processed, and an end of the thermocouple substrate 140 is located at a point that does not reach the center point of the substrate W to be thermally processed. Therefore, the light generated from a heat source device located above the thermocouple substrate 140 may be irradiated to the center point of the substrate W to be thermally processed.

In addition, a perforation hole 141 is formed at the end of the thermocouple substrate 140, and a pair of thermocouple wires 150 extending from the outside of the chamber 101 into the chamber 101 through the feed-through 110 are bonded at the inside of the perforation hole 141. That is, a bonding portion 151 of the thermocouple wire 150 is located in the perforation hole 141 formed at the end of the thermocouple substrate 140. Also, in order to increase accuracy when the bonding portion 151 of the thermocouple wire 150 indirectly measures the temperature of the substrate W to be thermally processed located below the thermocouple substrate 140, the bonding portion 151 is formed to pass through the perforation hole 141 and protrude on the bottom surface of the thermocouple substrate 140 in one embodiment.

Moreover, in forming the bonding portion 151, even though it is illustrated in the figures that the thermocouple wire 150 is formed at one point of the bottom surface of the thermocouple substrate 140 through the perforation hole 141, it is also possible that no perforation hole is formed and the bonding portion 151 is formed at an upper surface of a susceptor 160 or in the middle of the depth of the perforation hole 141, namely at the position of the thermocouple substrate 140, or that the number of thermocouple wires 150 is increased so that the bonding portion 151 is formed at a plurality of points, rather than one point.

In a state where the feed-through 110 configured in this way is mounted in the mounting hole 103 of the chamber 101, the substrate W to be thermally processed located at the bottom surface of the thermocouple substrate 140 is rotated and rapidly heat-treated. While the substrate W to be thermally processed is being rapidly heat-treated, the temperature of the thermocouple substrate 140 is measured through the thermocouple wire 150 on the assumption that the temperature of the thermocouple substrate 140 of the same material is also the same as that of the substrate W to be thermally processed.

In order to assume that the thermocouple substrate 140 and the substrate W to be thermally processed have the same temperature, the thermocouple substrate 140 and the substrate W are thermally processed so as to be located close to each other.

Meanwhile, depending on the type of the substrate W to be thermally processed, a susceptor may be located at a bottom surface of the substrate, or top and bottom surfaces thereof. If the susceptor is located at the substrate W to be thermally processed as described above, the susceptor 160 should also be located in the same position of the thermocouple substrate 140.

As shown in FIG. 4A and FIG. 4B, the susceptor 160 may be mounted only to the bottom surface of the thermocouple substrate 140 or to the top and bottom surfaces of the susceptor 160, respectively.

As described above, the spacing between the pair of insulators 130 changes depending on whether the susceptor 160 is mounted and the number of mounted susceptors.

For this, as shown in FIG. 5, the support rod 120 includes a body 121 having both sidewalls 121W and a bottom 121F, and a cover 123 for covering an open top surface of the body 121. In a state where the cover 123 is located at the top surface of the body 121, a bolt 125 passing through the cover 123 is fastened to a tab formed at both sidewalls 121W. Therefore, after the pair of insulators 130 and the thermocouple substrate 140, and also, if required, the susceptor 160 are located inside the body 121 of the support rod 120, the cover 123 is provided to cover the body 121, and the cover 123 is fastened and fixed to the body 121 using the bolt 125 to fix the insulators 130, the thermocouple substrate 140 and the susceptor 160 located inside the support rod 120.

Meanwhile, the feed-through 110 has a pin hole 117 (FIG. 5) formed in a longitudinal direction of the feed-through 110 so that the thermocouple wire 150 extends through the feed-through 110 from the outside to the perforation hole 141 at the end of the thermocouple substrate 140. The thickness of the thermocouple wire 150 is preferably less than 80% of the thickness of the substrate.

Figure 6A:
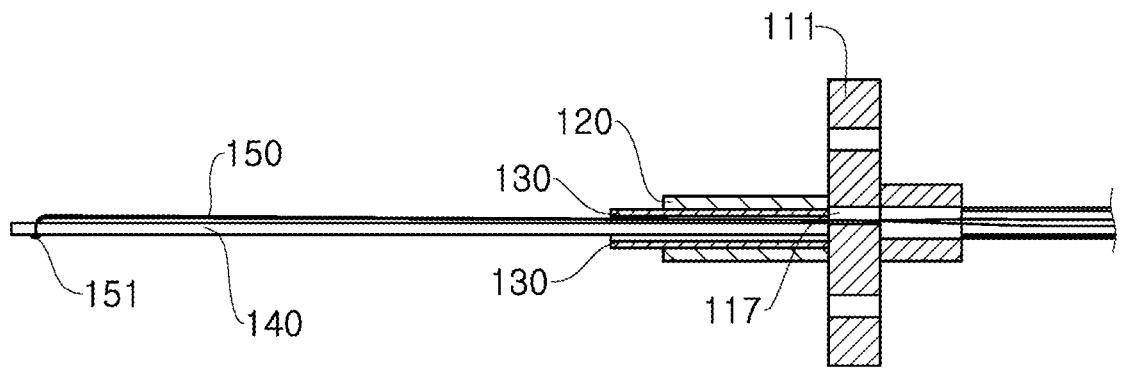
FIG. 6A to FIG. 6C are diagrams showing a kit where a tube-type insulator is mounted to the thermocouple kit of FIG. 3 according to one embodiment of the present disclosure.
Figure 6B:
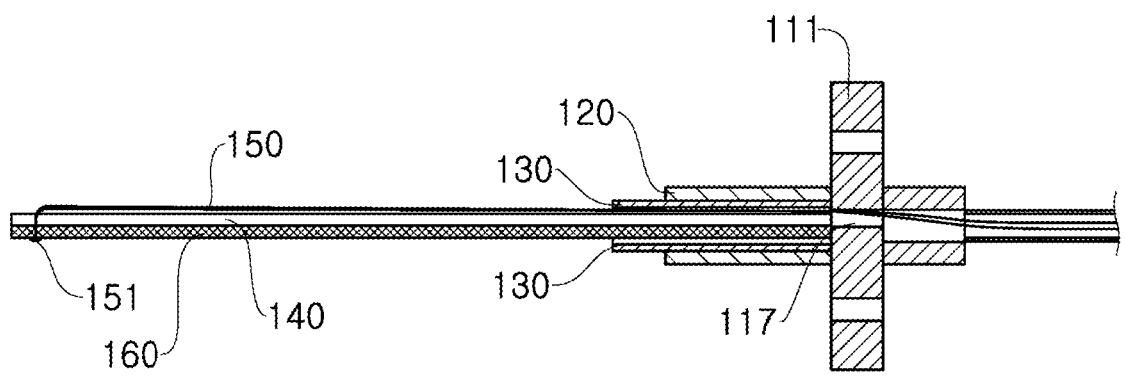
Figure 6C:
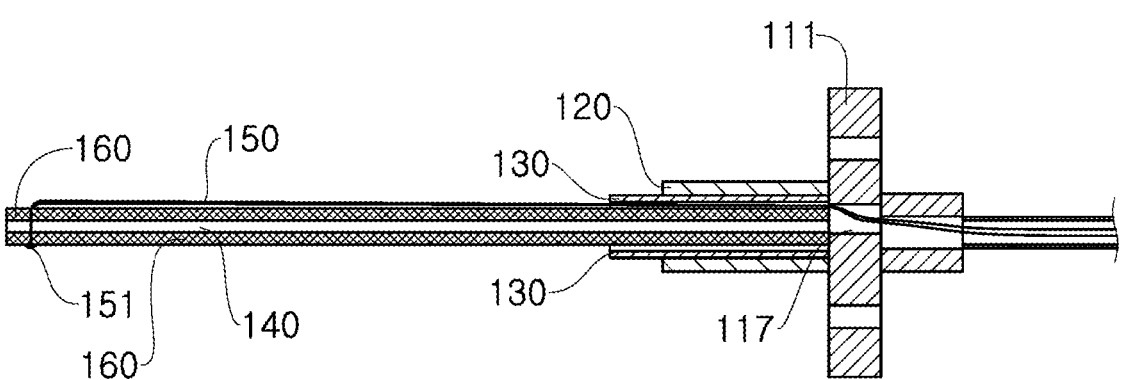

In the thermocouple kit 100 described above, the insulator 130 is described as being located at the top and bottom surfaces of the thermocouple substrate 140 in the form of a pad. However, as shown in FIG. 6A to FIG. 6C, the structure of the insulator 130 may be replaced with a tube shape.

In this case, the support rod is also changed into a tube shape, and the insulator is mounted to the feed-through such that the outer circumferential surface of the insulator comes into contact with the inner circumferential surface of the support rod.

At this time, the width of the thermocouple substrate corresponds to the diameter of the insulator, and both ends of the width of the thermocouple substrate are processed to have the same curvature radius as the inner diameter of the insulator so that the thermocouple substrate is inserted into the insulator. In addition, the susceptor located at the top or bottom surface of the thermocouple substrate may also be configured such that its width may be located inside the insulator and both ends of the width are processed to have the same curvature radius as the inner diameter of the insulator.

REFERENCE SYMBOLS

100: thermocouple kit
101: chamber
103: mounting hole
110: feed-through
111: flange
113: bolt
115: bolt hole
120: support rod
121: body
123: cover
125: bolt
130: insulator
140: thermocouple substrate
141: perforation hole
150: thermocouple wire
151: bonding portion
160: susceptor
W: substrate to be thermally processed

What is claimed is:

1. A rapid thermal processing apparatus, which includes a thermocouple installed to measure a temperature of a substrate to be thermally processed located inside a chamber, the rapid thermal processing apparatus comprising:
    a mounting hole formed in the chamber; and
    a thermocouple kit inserted into and mounted to the mounting hole so that a bonding portion of a thermocouple wire is located at a thermocouple substrate extending into the chamber,
    wherein the thermocouple kit includes a feed-through mounted in the mounting hole, a thermocouple substrate extending into the chamber from the feed-through, and a plurality of thermocouple wires extending from outside of the chamber into the chamber through pin holes formed in the feed-through, and
    wherein the feed-through includes a support rod inserted into and supported by the mounting hole, a flange formed at a rear side of the support rod and coming into contact with an outer surface of the chamber in a state where the support rod is inserted into the mounting hole, and a fastening means for fastening the flange to the chamber or releasing therefrom.

2. The rapid thermal processing apparatus according to claim 1, wherein the thermocouple substrate put into the chamber extends in a diameter direction of the substrate to be thermally processed, so that an end of the thermocouple substrate is located at a point not exceeding a center point of the substrate to be thermally processed.

3. The rapid thermal processing apparatus according to claim 1, wherein an end of the thermocouple substrate is inserted into the support rod, and an insulator is located between the thermocouple substrate and an inner surface of the support rod to block heat transfer between the thermocouple substrate and the support rod.

4. The rapid thermal processing apparatus according to claim 3, wherein the support rod includes a body having both sidewalls and a bottom, and a cover for covering an open top surface of the body, and
    wherein the insulator is located at an upper surface of the bottom, the end of the thermocouple substrate is placed on an upper surface of the insulator, and the cover is fastened to the body to cover the insulator in a state where the insulator is placed on an upper surface of the end of the thermocouple substrate.

5. The rapid thermal processing apparatus according to claim 4, wherein a plurality of tabs are formed at upper surfaces of both sidewalls, and a bolt is inserted into a perforation hole formed in the cover corresponding to the plurality of tabs and is fastened to the plurality of tabs to fix the cover to the body so that the insulator and the thermocouple substrate located therein are fixed.

6. The rapid thermal processing apparatus according to claim 1, wherein a thermocouple bonding portion is formed in a perforation hole formed at an end of the thermocouple substrate, and the thermocouple bonding portion is formed to protrude at a bottom surface of the thermocouple substrate through the perforation hole.

7. The rapid thermal processing apparatus according to claim 1, wherein the support rod has a tube shape, and the thermocouple substrate has a width identical to or smaller than an inner diameter of the support rod so that both ends of the width are processed to have a curvature radius of the support rod.

8. The rapid thermal processing apparatus according to claim 1,
    wherein a susceptor is located at a bottom surface of the thermocouple substrate, or a top surface and a bottom surface thereof.

* * * * *